(12) United States Patent
Happ

(10) Patent No.: US 7,714,312 B2
(45) Date of Patent: *May 11, 2010

(54) PHASE CHANGE MEMORY CELL WITH HIGH READ MARGIN AT LOW POWER OPERATION

(75) Inventor: Thomas Happ, Tarrytown, NY (US)

(73) Assignee: Qimonda AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/737,838

(22) Filed: Apr. 20, 2007

(65) Prior Publication Data

US 2007/0187664 A1  Aug. 16, 2007

Related U.S. Application Data

(63) Continuation of application No. 11/101,972, filed on Apr. 8, 2005, now Pat. No. 7,214,958, and a continuation-in-part of application No. 11/054,853, filed on Feb. 10, 2005, now Pat. No. 7,361,925.

(51) Int. Cl.
*H01L 29/04* (2006.01)

(52) U.S. Cl. .................... 257/3; 257/4; 257/5; 257/7; 257/751; 257/E31.029; 257/2

(58) Field of Classification Search .............. 257/3, 257/4, 5, 7, 751, E31.029, 2
See application file for complete search history.

(56) References Cited

U.S. PATENT DOCUMENTS

| 7,214,958 B2 * | 5/2007 | Happ .......................... 257/4 |
| 2001/0002046 A1 * | 5/2001 | Reinberg et al. ............... 257/3 |
| 2003/0094652 A1 * | 5/2003 | Hudgens et al. .............. 257/335 |
| 2003/0156468 A1 * | 8/2003 | Campbell et al. ........... 365/200 |
| 2004/0051161 A1 * | 3/2004 | Tanaka et al. ............... 257/528 |
| 2005/0192367 A1 * | 9/2005 | Ou et al. ........................ 521/64 |

FOREIGN PATENT DOCUMENTS

| KR | 10-2004-0032975 | 4/2004 |
| WO | 03021692 | 3/2003 |

* cited by examiner

*Primary Examiner*—Tan N Tran
(74) *Attorney, Agent, or Firm*—Dicke, Billig & Czaja, PLLC

(57) ABSTRACT

A memory cell device includes a first electrode, phase-change material adjacent the first electrode, a second electrode adjacent the phase-change material, a diffusion barrier adjacent the phase-change material, and isolation material adjacent the diffusion barrier for thermally isolating the phase-change material. The diffusion barrier prevents diffusion of the phase-change material into the isolation material.

18 Claims, 9 Drawing Sheets

PHASE CHANGE MEMORY CELL WITH HIGH READ MARGIN AT LOW POWER OPERATION

CROSS-REFERENCE TO RELATED APPLICATIONS

This application is a continuation of U.S. patent application Ser. No. 11/101,972, filed Apr. 8, 2005, and a continuation in part of U.S. patent application Ser. No. 11/054,853, filed Feb. 10, 2005, both of which are incorporated herein by reference.

BACKGROUND

The present invention relates to phase-change memories. In particular, a system and method are provided for a phase-change memory cell having a host material adjacent phase-change material such that heat leakage in the phase-change material is reduced. Phase-change materials may exhibit at least two different states. Consequently, phase-change material may be used in a memory cell to store a bit of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice.

Phase change in the phase-change materials may be induced reversibly. In this way, the memory may change from the amorphous to the crystalline state, and visa versa, in response to temperature changes. The temperature changes to the phase-change material may be achieved in a variety of ways. For example, a laser can be directed to the phase-change material, current may be driven through the phase-change material, or current or voltage can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell. In order to minimize the amount of power that is required in each memory cell, the amount of heat that leaks from the phase-change material should be minimized.

For these and other reasons, there is a need for the present invention.

SUMMARY

One embodiment of the present invention provides a memory cell device. The memory cell device includes a first electrode, phase-change material adjacent the first electrode, a second electrode adjacent the phase-change material, a diffusion barrier adjacent the phase-change material, and isolation material adjacent the diffusion barrier for thermally isolating the phase-change material. The diffusion barrier prevents diffusion of the phase-change material into the isolation material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
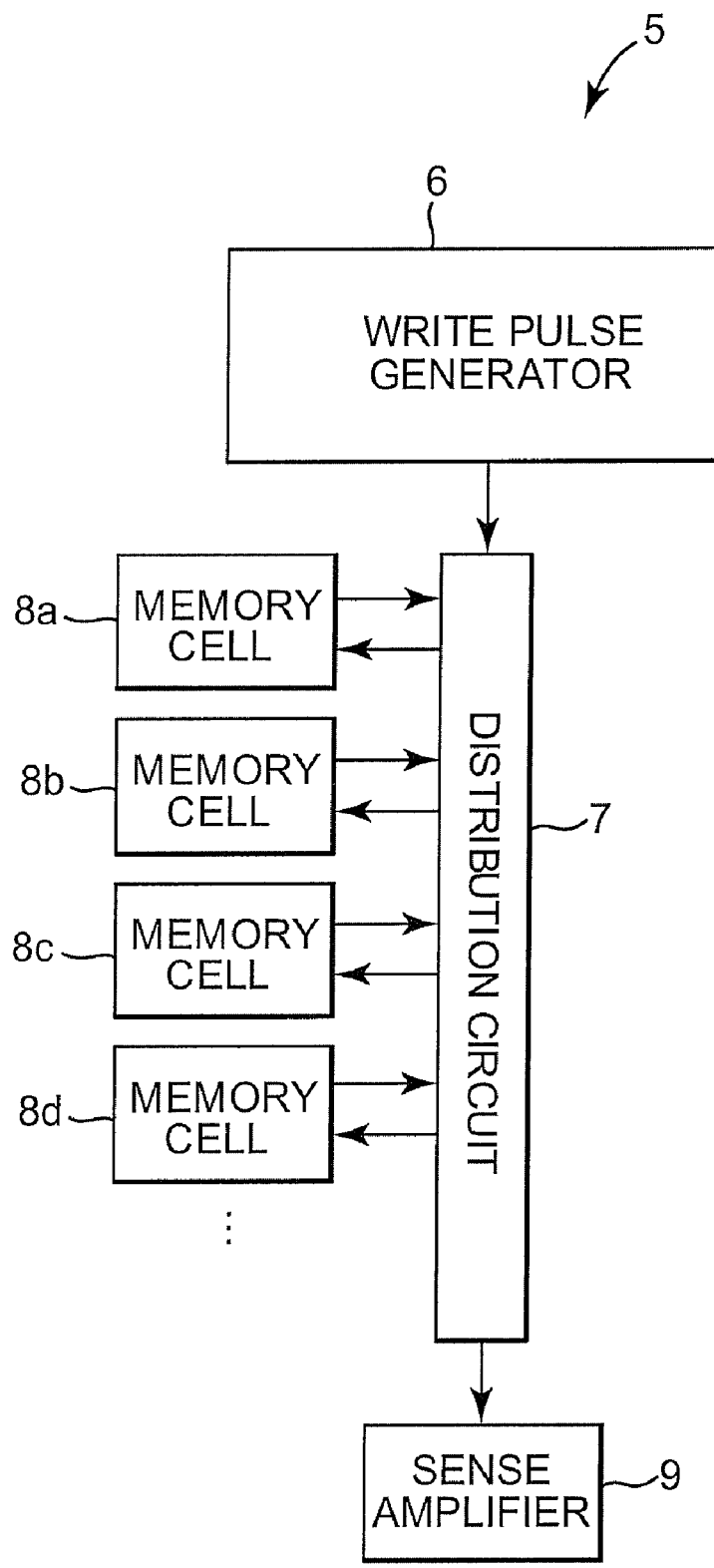
FIG. 1 illustrates a block diagram of a memory cell device.

FIG. 1 illustrates a block diagram of a memory cell device 5. Memory cell device 5 includes write pulse generator 6, distribution circuit 7, and memory cells 8a, 8b, 8c, and 8d and a sense amplifier 9. In one embodiment, memory cells 8a-8d are phase-change memory cells that are based on the amorphous to crystalline phase transition of the memory material. In one embodiment, write pulse generator 6 generates current or voltage pulses that are controllable directed to memory cells 8a-8d via distribution circuit 7. In one embodiment, distribution circuit 7 is a plurality of transistors that controllable direct current or voltage pulses to the memory, and in another embodiment, is a plurality of transistors that controllable direct current or voltage pulses to heaters adjacent to the phase-change memory cells.

In one embodiment, memory cells 8a-8d are made of a phase-change material that may be changed from an amorphous state to a crystalline state or crystalline state to amorphous under influence of temperature change. The degree of crystallinity thereby defines at least two memory states for storing data within memory cell device 5, which can be assigned to the bit values "0" and "1". The bit states of memory cells 8a-8d differ significantly in their electrical resistivity. In the amorphous state, a phase-change material will exhibit significantly higher resistivity than it will in the crystalline state. In this way, sense amplifier 9 may read the cell resistance such that the bit value assigned to a particular memory cell 8a-8d can be determined.

In order to program a memory cell 8a-8d within memory cell device 5, write pulse generator 6 generates a current or voltage pulse for heating the phase-change material in the target memory cell. In one embodiment, write pulse generator 6 generates an appropriate current or voltage pulse, which is fed into distribution circuit 7 and distributed to the appropriate target memory cell 8a-8d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is quickly heating the phase-change material of the target memory cell above its melting temperature, and then quickly quench cooling the material, thereby achieving the amorphous state.

Figure 2:
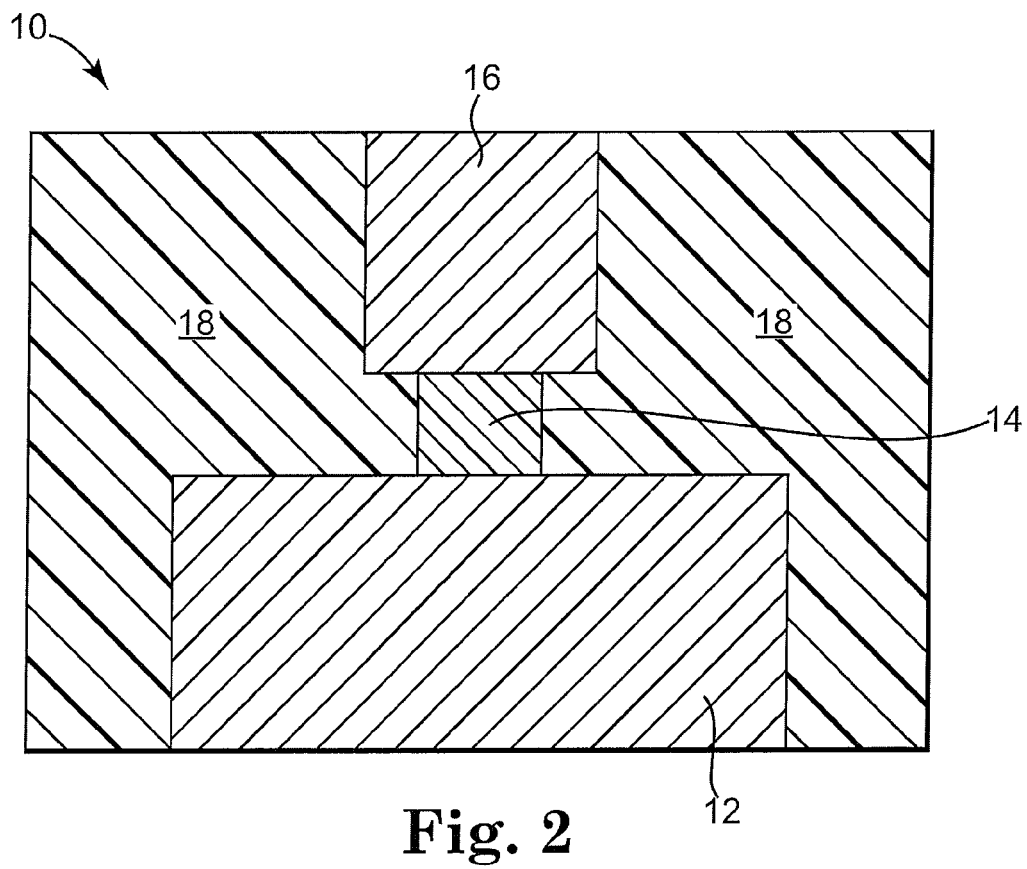
FIG. 2 illustrates a cross-sectional view through a phase-change memory cell.

FIG. 2 illustrates a cross-section view through an exemplary phase-change memory cell 10 of the active-in-via type. Phase-change memory cell 10 includes first electrode 12, phase-change material 14, second electrode 16, and insulator material 18. The phase change material 14 is laterally completely enclosed by insulation material 18, which defines the current path and hence the location of the phase change region in phase change material 14. A selection device, such as an active device like a transistor or diode, may be coupled to first electrode 12 to control the application of current or voltage to first electrode 12, and thus to phase-change material 14, in order to set and reset phase-change material 14.

In this way, during a set operation of phase-change memory cell 10, a set current or voltage pulse is selectively enabled to phase-change material 14 thereby heating it above its crystallization temperature (but below its melting temperature). In this way, phase-change material 14 reaches its crystalline state during this set operation. During a reset operation of phase-change memory cell 10, a reset current and/or voltage pulse is selectively enabled by the selection device and sent through first electrode 12 to phase-change material 14. The reset current or voltage quickly heats phase-change material 14 above its melting temperature, and then phase-change material 14 is quickly quench cooled to achieve its amorphous state.

Figure 3:
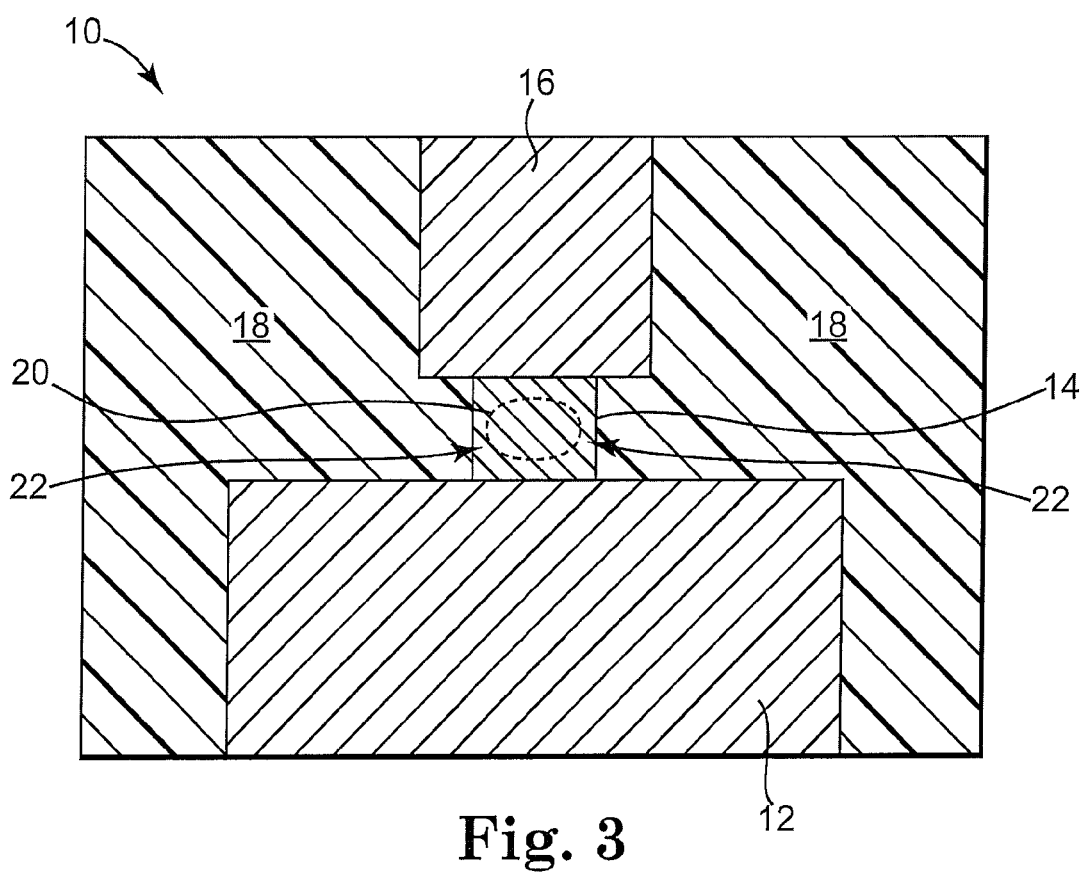
FIG. 3 illustrates a cross-sectional view through a phase-change memory cell with an illustrated temperature contour plot during a reset operation.

During a reset operation, phase-change material 14 typically begins heating and changing phases (melting) from the center of the cell due to thermal self-isolation of the phase-change material 14. Generated heat, however, may also diffuse into insulator material 18, which is typically an insulator material like silicon dioxide. Thus, in a low power reset operation, which avoids excessive overheating of the center, there is a crystalline, ring-shaped volume at the edge of phase-change material 14 remaining in the crystalline state due to incomplete melting. Such an incomplete melted area 22 is illustrated in FIG. 3, surrounding a sufficiently melted area 20 in phase-change material 14. A read operation undertaken subsequent to a reset in such a configuration provides low resistance shunt current paths in the area 22. This will mask the readout signal detected by sense amplifier 9 in the high resistance state.

Figure 4:
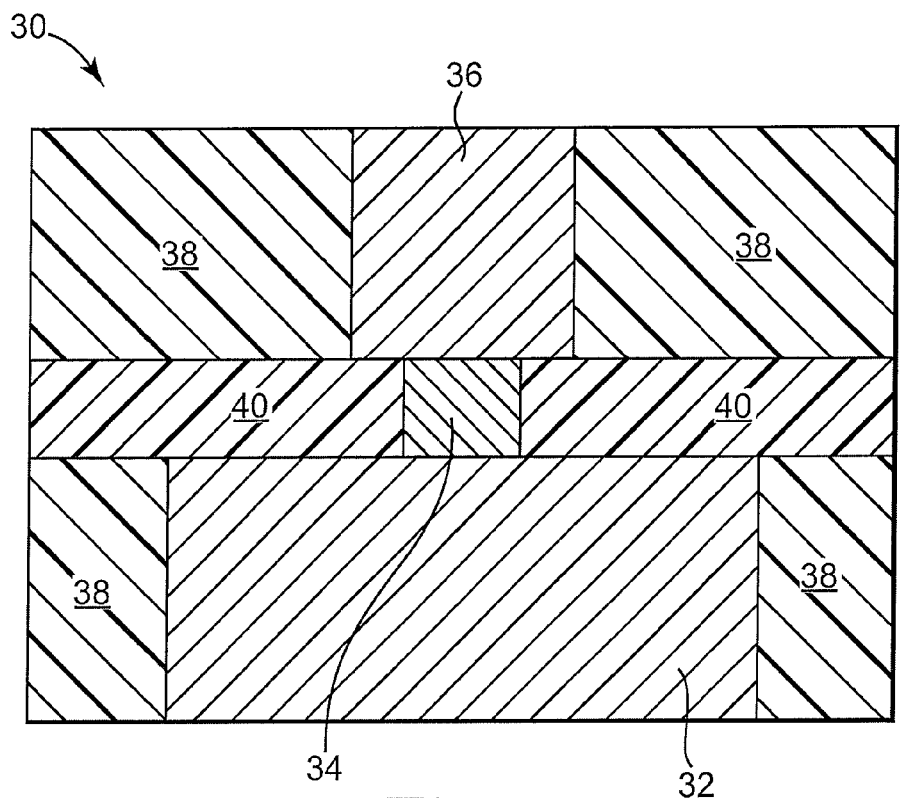
FIG. 4 illustrates a cross-sectional view through a phase-change memory cell with a laterally surrounding isolation material in accordance with one embodiment of the present invention.

FIG. 4 illustrates a cross-section view through an exemplary phase-change memory cell 30 in accordance with one embodiment of the present invention. Phase-change memory cell 30 includes first electrode 32, phase-change material 34, second electrode 36, and insulator material 38. In addition, phase-change memory cell 30 includes isolation material 40 adjacent phase-change material 34. In one embodiment, isolation material 40 is selected to have low thermal conductivity/diffusivity, thereby reducing the heat leakage from the edges of phase-change material 34.

In one embodiment, phase-change memory cell 30 is an active-in-via (AIV) cell such that a reset pulse typically melts phase-change material 34 starting at its center, and then the melting front moves outward. In one embodiment of phase-change memory cell 30, isolation material 40 surrounds phase-change material 34 at its outer edges. This reduces heat leakage from the edge of phase-change material 34 by the improved thermal insulation provided by the surrounding isolation material 40. In this way, unlike with phase-change memory device 10, melting of phase-change material 34 during a low power reset operation tends to go all the way out to its edge, thereby avoiding the crystalline, ring-shaped volume found in the prior embodiment.

Since even the outermost portions phase-change material 34 are melted (and subsequently amorphized during quench cooling), the total cell resistance will be much higher and read operation undertaken subsequent to a reset provides large read signals detected by sense amplifier 9. In this way, less input power is needed to achieve adequate read margins during reset operations. This allows lowering the reset pulse signal compared to a cell without isolation material 40, while still maintaining a switching of the full cell cross-section resulting in large read signals. Since the footprint of a scaled phase change memory cell is predominately determined by the width (and hence, area) of the select device required to drive the current during reset operation, this power reduction immediately translates into a more compact cell size.

Phase-change memory cell 30 may be fabricated in several ways in accordance with the present invention. For example, phase-change material 34 may be deposited and then etched, and then isolation material 40 formed adjacent to the edges of phase-change material 34. In addition, a layer of isolation material 40 may first be deposited, and then a via etched within the layer of isolation material 40. Phase-change material 34 may then be deposited in the via within the layer of isolation material 40.

Figure 5:
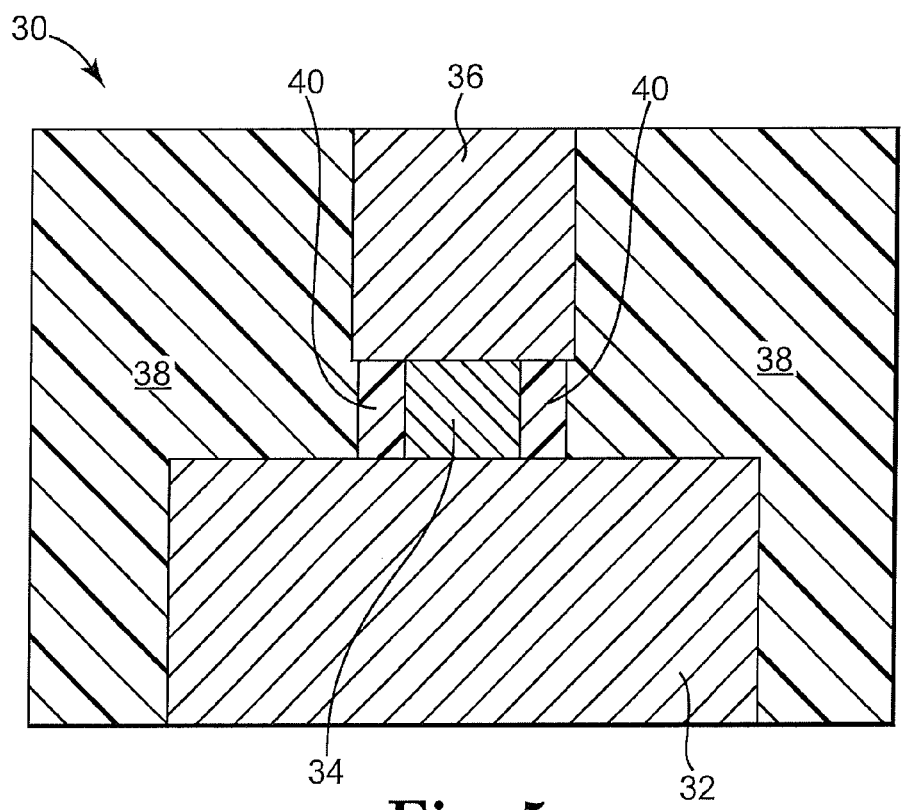
FIG. 5 illustrates a cross-sectional view through a phase-change memory cell with a laterally surrounding isolation material in accordance with another embodiment of the present invention.

FIG. 5 illustrates a cross-section view through an exemplary phase-change memory cell 30 in accordance with another embodiment of the present invention. Phase-change memory cell 30 includes first electrode 32, phase-change material 34, second electrode 36, and insulator material 38. In addition, phase-change memory cell 30 includes isolation material 40 adjacent phase-change material 34. Here, isolation material 40 is only placed immediately adjacent phase-change material 34, and is also selected to have low thermal conductivity. Thus, with this embodiment, less isolation material 40 is used, but heat leakage from the edges of phase-change material 34 is nonetheless effectively reduced. In this way, less additional input power is needed to achieve the increase in temperature that is needed for sufficient reset operations. In addition, with this embodiment, the mechanical stability for chemical mechanical polishing during the fabrication process is improved.

Figure 6:
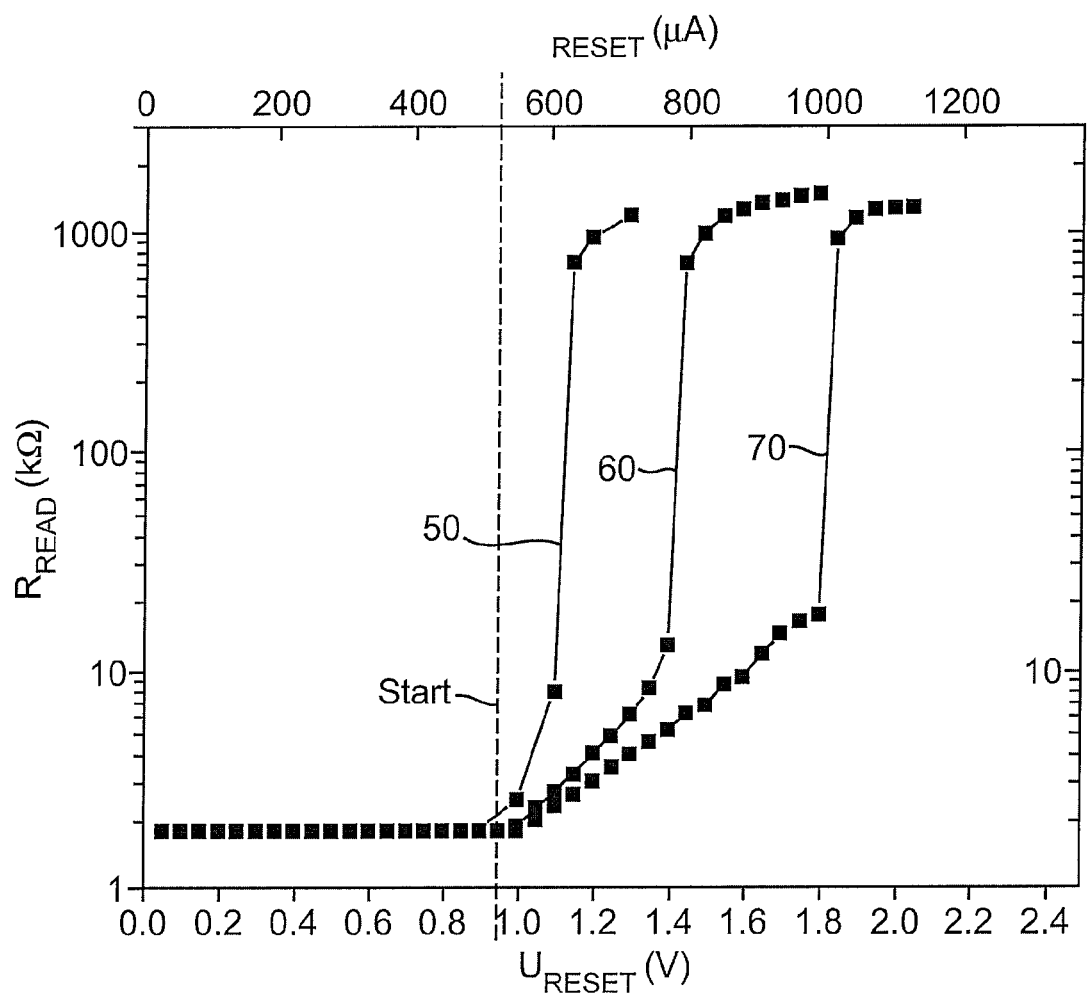
FIG. 6 illustrates a graph plotting the cell resistance as obtained during a read operation as a function of the reset pulse voltage and current.

FIG. 6 displays a graph plotting the cell resistance as obtained during a read operation as a function of the reset pulse voltage and current for three exemplary phase-change memory cells. The onset of melting at the center of the phase change cell is illustrated by a dotted vertical line. Line 70 in FIG. 6 illustrates the characteristics of a phase-change memory cell where the phase-change material is surrounded by silicon dioxide as insulating material. Here, during a low power reset around 1.0-1.5 V, the cell does not display a sharp switching characteristic, but instead displays a long lag phase having relatively low read resistance. This is due to the partial melting of the phase change material in the cell discussed earlier, which results in the highly conductive connection at the outer edge of the phase change material.

Line 60 in FIG. 6 illustrates the characteristics of a phase-change memory cell where the phase-change material is surrounded by a thermal insulating material having a relatively low dielectric constant ("low-k"), such as a porous oxide. Here, during a reset the read resistance displays an improved switching characteristic over line 70, and displays shorter lag phase having relatively higher read resistance.

Line 50 in FIG. 6 illustrates the characteristics of a phase-change memory cell where the phase-change material is surrounded by a thermal insulating material having a relatively low-k, such as Aerogel. Here, during a reset the read resistance displays an improved and sharp switching characteristic over line 60, and the lag phase of line 70 virtually vanishes. The read resistance illustrates a sharp transition over several orders of magnitude.

In one embodiment, isolation material 40 is a good thermal insulator dielectric material such as a porous oxide film having a thermal conductivity between 0.1 and 0.8 W/(mK). In one embodiment, isolation material 40 may be a dielectric material such as Aerogel material with a thermal conductivity of about 0.12-0.18 W/mK, and in another it may be a templated porous oxide dielectric such as Philk with a thermal conductivity of about 0.13-0.17 W/mK.

Phase-change material 34 may be made up of a variety of materials in accordance with the present invention. Generally, chalcogenide alloys that contain one or more elements from Column IV of the periodic table are useful as such materials. In one embodiment, phase-change material 34 of memory cell 30 is made up of a chalcogenide compound material, such as GeSbTe or AgInSbTe. In another embodiment, the phase change material can be chalcogen-free such as GeSb, GaSb or GeGaSb.

Although the above-mentioned low-k dielectric materials function as isolation material 40 for these types of phase-change materials 34, other low-k dielectrics may also be usable for different types of phase-change materials that may be operated at relatively higher temperatures. Such low-k dielectric materials include SiLK, Coral, LKD-5109, Orion® 2.2, CF-Polymer, and others.

Use of a low-k dielectric material surrounding the phase-change material in a phase-change memory cell allows a lowering of the reset pulse power (current and/or voltage) compared to a phase-change cell without low-k dielectric material surrounding the phase-change material, while still maintaining a switching of the full cell cross-section resulting in large read signals. This allows for reduced phase-change memory cell size and thus chip size as well, allowing for increased chip density.

FIGS. 7-24 illustrate two embodiments for fabricating a phase-change memory cell. FIGS. 7-14 and FIGS. 15-24 illustrate embodiments for fabricating a phase-change memory cell, such as phase-change memory cell 30 illustrated in FIG. 4.

Figure 7:
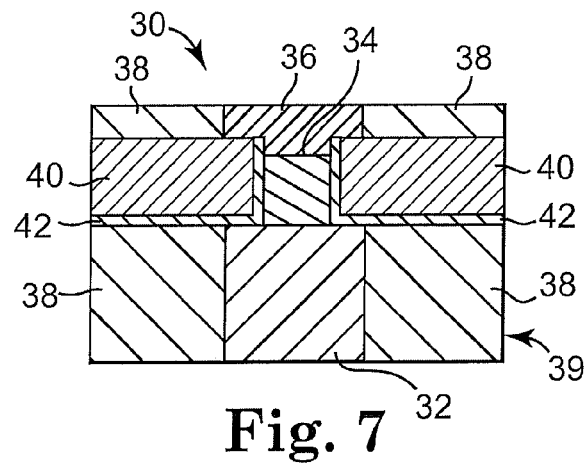
FIG. 7 illustrates a cross-sectional view through a phase-change memory cell with a laterally surrounding diffusion barrier and isolation material in accordance with another embodiment of the present invention.

FIG. 7 illustrates a cross-sectional view through a phase-change memory cell 30 in accordance with another embodiment of the present invention. Phase-change memory cell 30 includes first electrode 32, phase-change material 34, second electrode 36, and insulator material 38. In addition, phase-change memory cell 30 includes optional diffusion barrier 42 adjacent phase-change material 34, and isolation material 40 adjacent optional diffusion barrier 42. In other embodiments, diffusion barrier 42 is excluded. Phase-change material 34 provides a storage location for storing a bit of data.

Diffusion barrier 42 prevents the diffusion of phase-change material 34 into isolation material 40. In one embodiment, diffusion barrier 42 includes SiN or another suitable barrier material. In one embodiment, isolation material 40 is selected to have low thermal conductivity/diffusivity, thereby reducing the heat leakage from the edges of phase-change material 34. In one embodiment, phase-change memory cell 30 is a pillar AIV phase-change memory cell. The process for fabricating this embodiment of memory cell 30 is illustrated in the following FIGS. 8-14.

Figure 8:
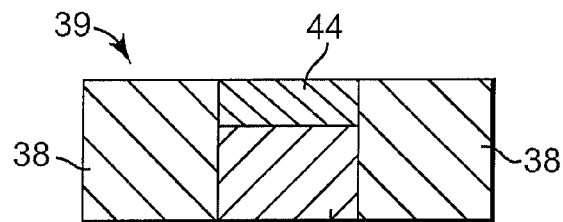
FIG. 8 illustrates a cross-sectional view of one embodiment of a preprocessed wafer.

FIG. 8 illustrates a cross-sectional view of one embodiment of a preprocessed wafer 39. Preprocessed wafer 39 includes insulation material 38, first electrode 32, optional contact material 44, and lower wafer layers (not shown). In other embodiments, contact material 44 is excluded. First electrode 32 is a tungsten plug, copper plug, or another suitable electrode. Contact material 44 comprises Ta, TaN, TiN, or another suitable contact material. Optional contact material 44 is provided in one embodiment by etching first electrode 32 to form a recess, filling the recess with contact material 44, and planarizing to provide preprocessed wafer 39. In other embodiments, contact material 44 is provided using another suitable process.

Figure 9:
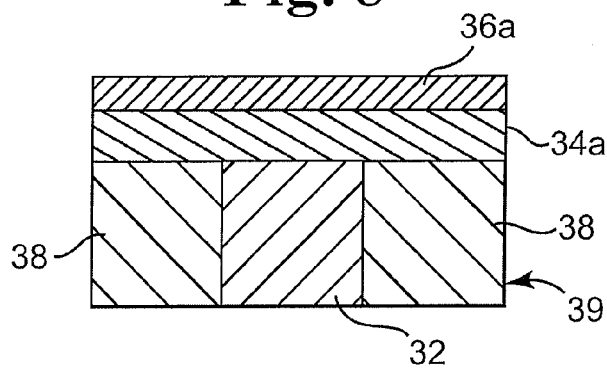
FIG. 9 illustrates a cross-sectional view of one embodiment of the preprocessed wafer, a phase-change material layer, and an electrode material layer.

FIG. 9 illustrates a cross-sectional view of one embodiment of preprocessed wafer 39, a phase-change material layer 34a, and an electrode material layer 36a. A planar deposition of phase-change material, such as a chalcogenide compound material or another suitable phase-change material, over preprocessed wafer 39 provides phase-change material layer 34a. A planar deposition of electrode material, such as TiN, TaN, or another suitable electrode material, over phase-change material layer 34a provides electrode material layer 36a. Phase-change material layer 34a and electrode material layer 36a are deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Figure 10:
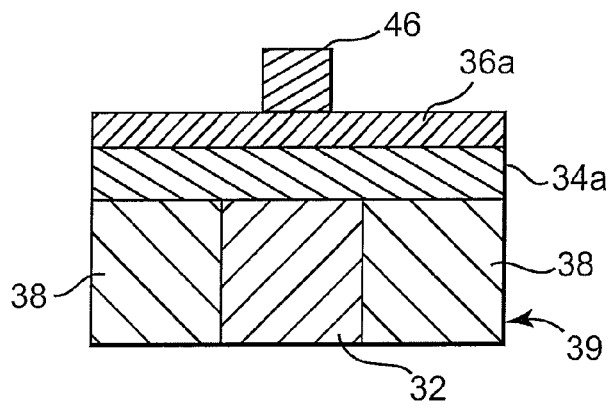
FIG. 10 illustrates a cross-sectional view of one embodiment of the preprocessed wafer, phase-change material layer, electrode material layer, and a sublithographic mask layer.

FIG. 10 illustrates a cross-sectional view of one embodiment of preprocessed wafer 39, phase-change material layer 34a, electrode material layer 36a, and a sublithographic mask layer 46. In one embodiment, sublithographic mask layer 46 is provided by spin-coating photoresist onto electrode material layer 36a and performing optical lithography to define an initial mask layer. The initial mask layer is then reduced to provide sublithographic mask layer 46 through a photoresist trimming process. Alternatively, an additional hard mask layer can be used and trimmed using a wet chemical pullback etch. In one embodiment, sublithographic mask layer 46 is positioned approximately above the center of first electrode 32.

Figure 11:
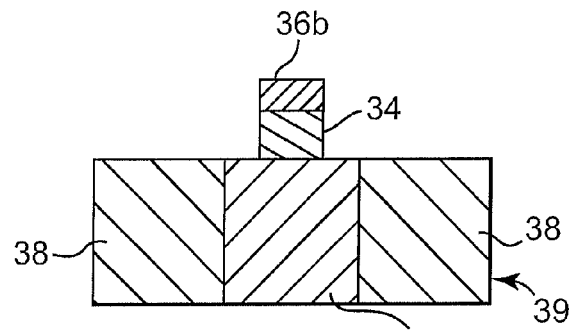
FIG. 11 illustrates a cross-sectional view of one embodiment of the preprocessed wafer, phase-change material layer, and electrode material layer after etching the electrode material layer and the phase-change material layer.

FIG. 11 illustrates a cross-sectional view of one embodiment of preprocessed wafer 39, phase-change material layer 34, and electrode material layer 36b after etching electrode material layer 36a and phase-change material layer 34a. The portions of electrode material layer 36a and phase-change material layer 34a not masked by sublithographic mask layer 46 are etched with a dry etch or another suitable etch to provide electrode material layer 36b and phase-change material layer 34. After etching, sublithographic mask layer 46 is removed using a photoresist stripping method.

Figure 12:
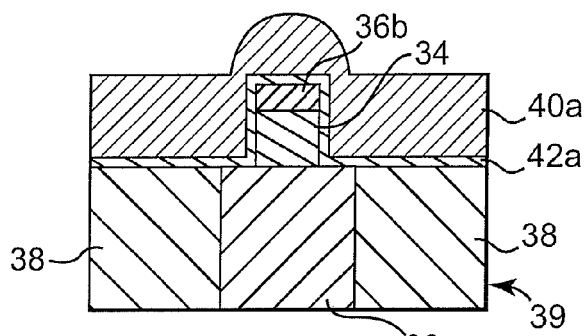
FIG. 12 illustrates a cross-sectional view of one embodiment of the preprocessed wafer, phase-change material layer, electrode material layer, a diffusion barrier layer, and an isolation material layer.

FIG. 12 illustrates a cross-sectional view of one embodiment of preprocessed wafer 39, phase-change material layer 34, electrode material layer 36b, an optional diffusion barrier layer 42a, and an isolation material layer 40a. In another embodiment, optional diffusion barrier layer 42a is excluded. Diffusion barrier layer 42a is provided by depositing SiN or another suitable barrier material over exposed portions of preprocessed wafer 39, phase-change material layer 34, and electrode material layer 36b using CVD, ALD, MOCVD, PVD, JVP, or other suitable deposition technique. In one embodiment, this deposition is conformal to achieve the same thickness on the sidewalls of phase-change material layer 34 and on exposed portions of preprocessed wafer 39. Isolation material layer 40a is provided by preferably conformally depositing a material having low thermal conductivity/diffusivity over diffusion barrier material layer 42a using CVD, ALD, MOCVD, PVD, JVP, or other suitable deposition technique.

Figure 13:
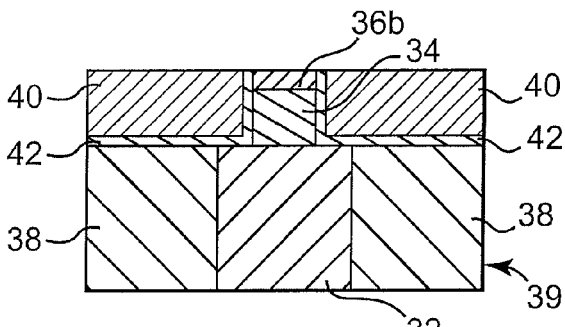
FIG. 13 illustrates a cross-sectional view of one embodiment of the preprocessed wafer, phase-change material layer, electrode material layer, diffusion barrier layer, and isolation material layer after planarization.

FIG. 13 illustrates a cross-sectional view of one embodiment of preprocessed wafer 39, phase-change material layer 34, electrode material layer 36b, diffusion barrier layer 42, and isolation material layer 40 after planarization of isolation material layer 40a and diffusion barrier layer 42a. Isolation material layer 40a and diffusion barrier layer barrier 42a are planarized to expose electrode material layer 36b. Isolation material layer 40a and diffusion barrier layer 42a are planarized using chemical mechanical polishing (CMP) or another suitable planarazation technique to provide isolation material layer 40 and diffusion barrier layer 42.

Figure 14:
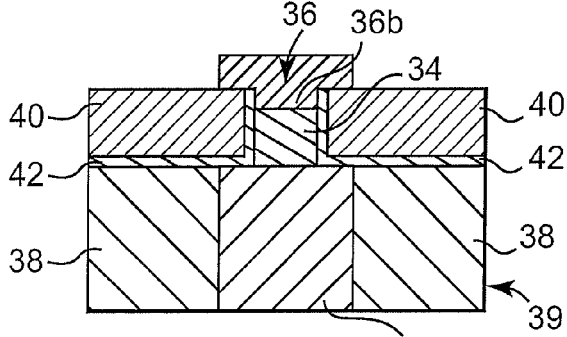
FIG. 14 illustrates a cross-sectional view of one embodiment of the preprocessed wafer, phase-change material layer, electrode material layer, diffusion barrier layer, isolation material layer, and an additional electrode material layer after etching the additional electrode material layer.

FIG. 14 illustrates a cross-sectional view of one embodiment of preprocessed wafer 39, phase-change material layer 34, electrode material layer 36b, diffusion barrier layer 42, isolation material layer 40, and an additional electrode material layer after etching the additional electrode material layer. In one embodiment, an additional diffusion barrier layer (not shown) is deposited over exposed portions of isolation material layer 40, diffusion barrier layer 42, and electrode material layer 36b. The additional diffusion barrier layer is then etched to expose electrode material layer 36b. Regardless, an additional electrode material layer is deposited over exposed portions of isolation material layer 40, diffusion barrier layer 42, and electrode layer 36b and etched to provide second electrode 36. Second electrode 36 comprises TiN, TaN, or another suitable electrode material. In one embodiment, second electrode 36 provides a landing pad for the next level metalization plug. Additional insulation material is then deposited around second electrode 36 to provide phase-change memory cell 30 illustrated in FIG. 7.

Figure 15:
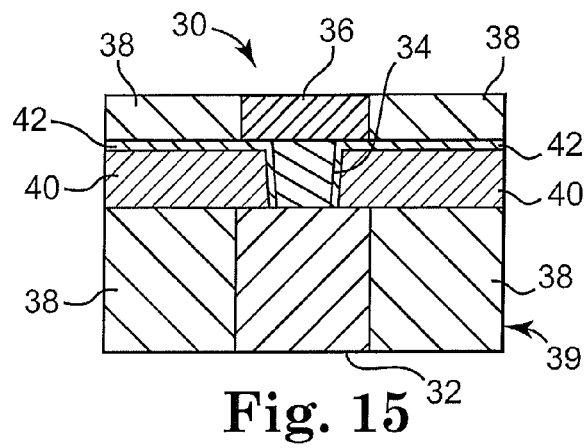
FIG. 15 illustrates a cross-sectional view through a phase-change memory cell with a laterally surrounding diffusion barrier and isolation material in accordance with another embodiment of the present invention.

FIG. 15 illustrates a cross-sectional view through a phase-change memory cell 30 in accordance with another embodiment of the present invention. Phase-change memory cell 30 includes first electrode 32, phase-change material 34, second electrode 36, and insulator material 38. In addition, phase-change memory cell 30 includes optional diffusion barrier 42 adjacent phase-change material 34, and isolation material 40 adjacent optional diffusion barrier 42. In other embodiments, diffusion barrier 42 is excluded. Phase-change material 34 provides a storage location for storing a bit of data. In one embodiment, phase-change material 34 has vertical sidewalls. In another embodiment, phase-change material 34 has V-shaped sidewalls.

Diffusion barrier 42 prevents the diffusion of phase-change material 34 into isolation material 40. In one embodiment, diffusion barrier 42 includes SiN or another suitable barrier material. In one embodiment, isolation material 40 is selected to have low thermal conductivity/diffusivity, thereby reducing the heat leakage from the edges of phase-change material 34. In one embodiment, phase-change memory cell 30 is a V-cell AIV phase-change memory cell. The process for fabricating this embodiment of memory cell 30 is illustrated in the following FIGS. 16-24.

Figure 16:
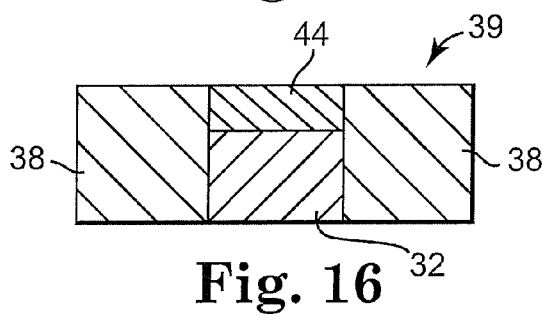
FIG. 16 illustrates a cross-sectional view of one embodiment of a preprocessed wafer.

FIG. 16 illustrates a cross-sectional view of one embodiment of a preprocessed wafer 39. Preprocessed wafer 39 includes insulation material 38, first electrode 32, optional contact material 44, and lower wafer layers (not shown). In other embodiments, contact material 44 is excluded. First electrode 32 is a tungsten plug, copper plug, or another suitable electrode. Contact material 44 comprises Ta, TaN, TiN, or another suitable contact material. Optional contact material 44 is provided in one embodiment by etching first electrode 32 to form a recess, filling the recess with contact material 44, and planarizing to provide preprocessed wafer 39. In other embodiments, contact material 44 is provided using another suitable process.

Figure 17:
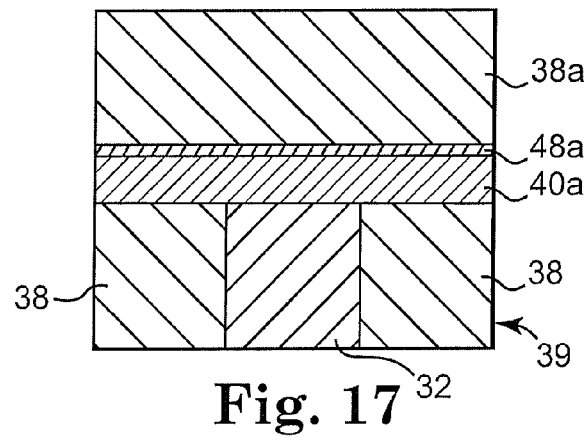
FIG. 17 illustrates a cross-sectional view of one embodiment of the preprocessed wafer, an isolation material layer, a stop layer, and a sacrificial layer.

FIG. 17 illustrates a cross-sectional view of one embodiment of preprocessed wafer 39, an isolation material layer 40a, a stop layer 48a, and a sacrificial layer 38a. A planar deposition of a material having low thermal conductivity/diffusivity over preprocessed wafer 39 provides isolation material layer 40a. A planar deposition of SiN or another suitable material over isolation material layer 40a provides stop layer 48a. A planar deposition of an insulating material, such as SiO$_2$, over stop layer 48a provides sacrificial layer 38a. Isolation material layer 40, stop layer 48, and sacrificial layer 38 are deposited using CVD, ALD, MOCVD, PVD, JVP, or other suitable deposition technique.

Figure 18:
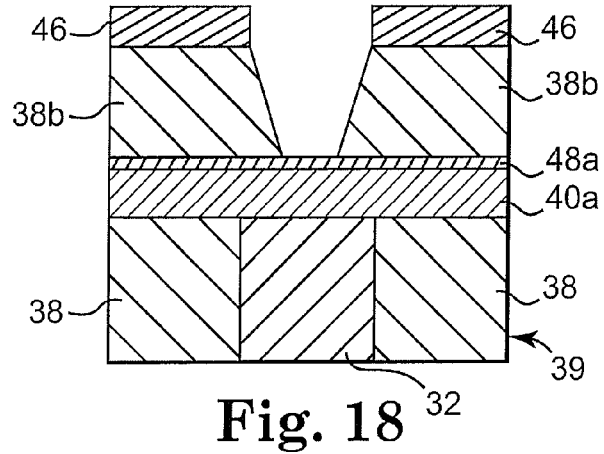
FIG. 18 illustrates a cross-sectional view of one embodiment of the preprocessed wafer, isolation material layer, stop layer, sacrificial layer, and a mask layer after etching the sacrificial layer.

FIG. 18 illustrates a cross-sectional view of one embodiment of preprocessed wafer 39, isolation material layer 40a, stop layer 48a, sacrificial layer 38b, and a mask layer 46 after etching sacrificial layer 38a. The portion of sacrificial layer 38a not masked by mask layer 46 is etched using a tapered via etch down to stop layer 48 to provide sacrificial layer 38b. The tapered via etch reduces the contact dimensions for phase-change memory cell 30 to sublithographic dimensions. In one embodiment, the tapered via is positioned approximately above the center of first electrode 32.

Figure 19:
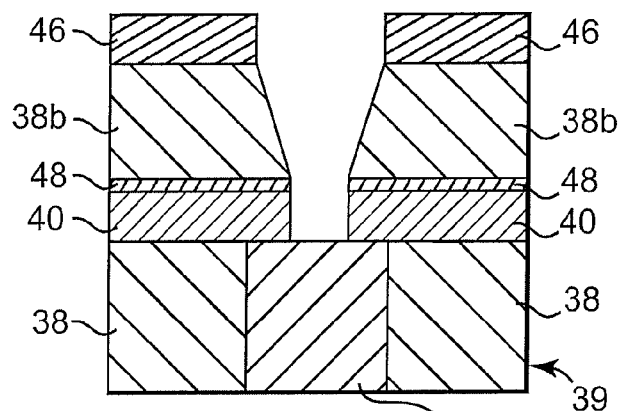
FIG. 19 illustrates a cross-sectional view of one embodiment of the preprocessed wafer, isolation material layer, stop layer, sacrificial layer, and mask layer after etching the stop layer and the isolation material layer.

FIG. 19 illustrates a cross-sectional view of one embodiment of preprocessed wafer 39, isolation material layer 40, stop layer 48, sacrificial layer 38b, and mask layer 46 after etching stop layer 48a and isolation material layer 40a. Stop layer 48a is etched using a dry etch or another suitable etch to transfer the sublithographic opening of sacrificial layer 38b to provide stop layer 48. Isolation material layer 40a is etched using an oxide etch or another suitable etch to transfer the sublithographic opening of sacrificial layer 38b to provide isolation material layer 40 having a via positioned approximately above the center of first electrode 32.

Figure 20:
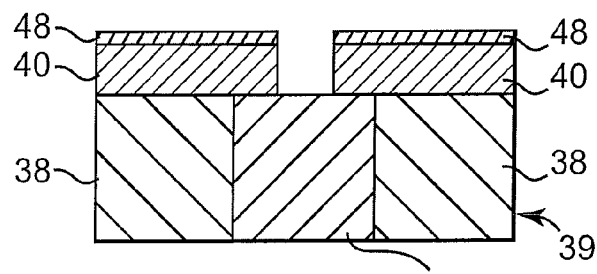
FIG. 20 illustrates a cross-sectional view one embodiment of the preprocessed wafer, isolation material layer, and stop layer after removing the mask layer and the sacrificial layer.

FIG. 20 illustrates a cross-sectional view of one embodiment of preprocessed wafer 39, isolation material layer 40, and stop layer 48 after removing mask layer 46 and sacrificial layer 38b. Mask layer 46 is removed using an O$_2$ plasma photoresist strip and dry process or another suitable photoresist removal method. Sacrificial layer 38b is removed using an anisotropic oxide etch or another suitable method.

Figure 21:
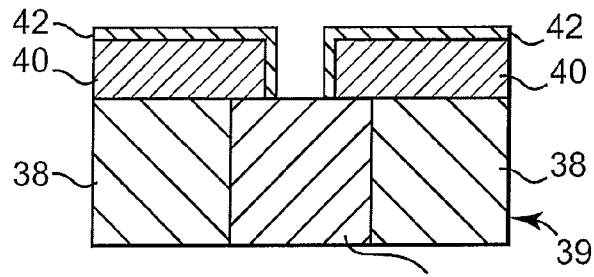
FIG. 21 illustrates a cross-sectional view of one embodiment of the preprocessed wafer, isolation material layer, and a diffusion barrier layer after etching the diffusion barrier layer.

FIG. 21 illustrates a cross-sectional view of one embodiment of preprocessed wafer 39, isolation material layer 40, and an optional diffusion barrier layer 42 after etching the optional diffusion barrier layer. In other embodiments, diffusion barrier layer 42 is excluded. Diffusion barrier layer 42 is provided by conformally depositing SiN or another suitable barrier material over exposed portions of preprocessed wafer 39 and isolation material layer 40 using CVD, ALD, MOCVD, PVD, JVP, or other suitable deposition technique. An anisotropic back etch or another suitable method is used to remove the diffusion barrier material to expose first electrode 32. In one embodiment, both stop layer 48 and diffusion barrier layer 42 comprise SiN, therefore stop layer 48 combines with the diffusion barrier layer to provide diffusion barrier layer 42.

Figure 22:
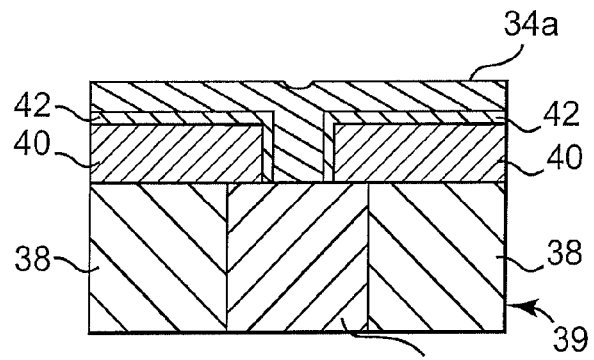
FIG. 22 illustrates a cross-sectional view of one embodiment of the preprocessed wafer, isolation material layer, diffusion barrier layer, and a phase-change material layer.

FIG. 22 illustrates a cross-sectional view of one embodiment of preprocessed wafer 39, isolation material layer 40, diffusion barrier layer 42, and a phase-change material layer 34a. Phase-change material, such as a chalcogenide compound material or another suitable phase-change material, is deposited over exposed portions of preprocessed wafer 39 and diffusion barrier layer 42 to provide phase-change material layer 34a. Phase-change material layer 34a is deposited using CVD, ALD, MOCVD, PVD, JVP, or other suitable deposition technique.

Figure 23:
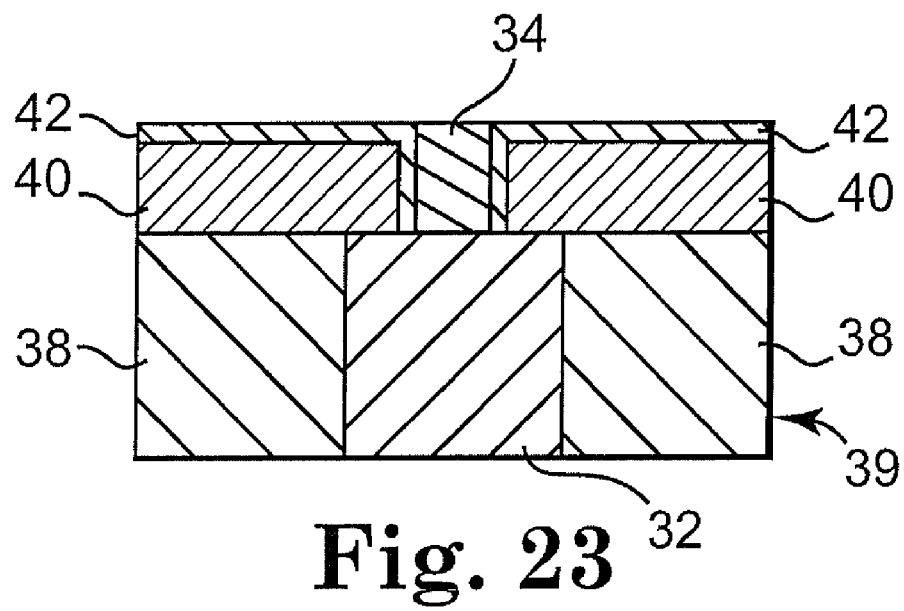
FIG. 23 illustrates a cross-sectional view of one embodiment of the preprocessed wafer, isolation material layer, diffusion barrier layer, and phase-change material layer after planarization.

FIG. 23 illustrates a cross-sectional view of one embodiment of preprocessed wafer 39, isolation material layer 40, diffusion barrier layer 42, and phase-change material layer 34 after planarization of phase-change material layer 34a. Phase-change material layer 34a is planarized to expose diffusion barrier layer 42 and provide a sublithographic phase-change material layer 34. Phase-change material layer 34a is planarized using CMP or another suitable planarization technique.

Figure 24:
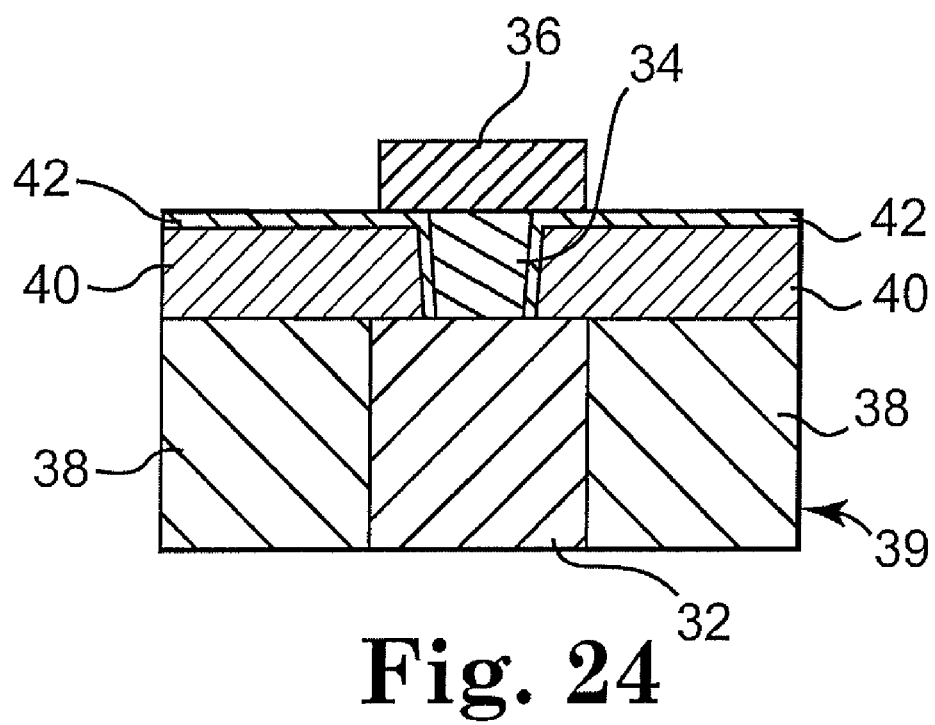
FIG. 24 illustrates a cross-sectional view of one embodiment of the preprocessed wafer, isolation material layer, diffusion barrier layer, phase-change material layer, and second electrode after etching the electrode material layer.

FIG. 24 illustrates a cross-sectional view of one embodiment of preprocessed wafer 39, isolation material layer 40, diffusion barrier layer 42, phase-change material layer 34, and second electrode 36 after etching an electrode material layer. An electrode material layer is deposited over exposed portions of diffusion barrier layer 42 and phase-change material layer 34 and etched to provide second electrode 36. Second electrode 36 comprises TiN, TaN, or another suitable electrode material. In one embodiment, second electrode 36 provides a landing pad for the next level metalization plug. Additional insulation material 38 is then deposited around second electrode 36 to provide phase-change memory cell 30 illustrated in FIG. 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell device comprising:
   a first electrode;
   resistivity changing material adjacent the first electrode;
   a second electrode adjacent the resistivity changing material;
   a diffusion barrier adjacent the resistivity changing material and directly contracting the first electrode and the second electrode; and
   isolation material adjacent the diffusion barrier for thermally isolating the resistivity changing material, the isolation material comprising a porous dielectric oxide film having a thermal conductively between 0.1 and 0.8 W/mk,
   wherein the diffusion barrier prevents diffusion of the resistivity changing material into the isolation material.

2. The memory cell device of claim 1, wherein the resistivity changing material comprises a chalcogenide.

3. The memory cell device of claim 1, wherein the diffusion barrier comprises SiN.

4. The memory cell device of claim 1, wherein the dielectric material limits heat leakage from the resistivity changing material.

5. The memory cell device of claim 1, wherein the diffusion barrier laterally surrounds the resistivity changing material.

6. The memory cell device of claim 1, wherein the first electrode comprises one of a tungsten plug and a copper plug.

7. The memory cell device of claim 1, further comprising:
first insulation material laterally surrounding the first electrode; and
second insulation material laterally surrounding the second electrode,
wherein the diffusion barrier directly contacts a face of one of the first insulation material and the second insulation material, the face perpendicular to a current path through the resistivity changing material.

8. The memory cell device of claim 1, wherein a width of the resistivity changing material is less than a width of the first electrode and a width of the second electrode.

9. A memory cell device comprising:
a first electrode;
phase-change material adjacent the first electrode;
a second electrode adjacent the phase-change material;
first means adjacent the phase-change material for thermally isolating the phase-change material; and
second means adjacent the first means and directly contacting the first electrode and the second electrode for preventing diffusion of the phase-change material into the first means,
wherein the first means comprises a dielectric material that limits heat leakage from the phase-change material, and
wherein the dielectric material comprises a porous oxide film having a thermal conductivity between 0.1 and 0.8 W/mk.

10. The memory cell device of claim 9, wherein the phase-change material comprises a chalcogenide.

11. The memory cell device of claim 9, wherein the second means comprises SiN.

12. The memory cell device of claim 9, wherein the first means laterally surrounds the phase-change material.

13. An integrated circuit comprising:
a first electrode;
a second electrode;
resistivity changing material between the first electrode and the second electrode;
a diffusion barrier laterally surrounding the resistivity changing material and directly contacting the first electrode and the second electrode; and
isolation material adjacent the diffusion barrier for thermally isolating the resistivity changing material,
wherein the diffusion barrier prevents diffusion of the resistivity changing material into the isolation material,
wherein the isolation material comprises a dielectric material that limits heat leakage from the resistivity changing material, and
wherein the dielectric material comprises a porous oxide film having a thermal conductivity between 0.1 and 0.8 W/mk.

14. The integrated circuit of claim 13, wherein the resistivity changing material comprises a phase-change material.

15. The integrated circuit of claim 14, wherein the phase-change material comprises a chalcogenide.

16. The integrated circuit of claim 13, wherein the diffusion barrier comprises SiN.

17. The integrated circuit of claim 13, wherein the isolation material laterally surrounds the resistivity changing material.

18. An integrated circuit comprising:
a first electrode;
phase-change material adjacent the first electrode;
a second electrode adjacent the phase-change material;
isolation material for thermally isolating the phase-change material, the isolation material comprising a porous dielectric oxide film having a thermal conductivity between 0.1 and 0.8 W/mk; and
a diffusion barrier for preventing diffusion of the phase-change material into the isolation material,
wherein one of the first electrode and the second electrode directly contacts the isolation material.

* * * * *